(12) United States Patent
Yamamoto

(10) Patent No.: US 11,515,656 B2
(45) Date of Patent: Nov. 29, 2022

(54) CIRCUIT CONNECTION MODULE

(71) Applicant: Yazaki Corporation, Tokyo (JP)

(72) Inventor: Shohei Yamamoto, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 61 days.

(21) Appl. No.: 17/237,812

(22) Filed: Apr. 22, 2021

(65) Prior Publication Data

US 2021/0359453 A1 Nov. 18, 2021

(30) Foreign Application Priority Data

May 18, 2020 (JP) .............................. JP2020-086888

(51) Int. Cl.
| | | |
|---|---|---|
| *H05K 7/20* | (2006.01) | |
| *H01R 13/405* | (2006.01) | |
| *H01R 12/57* | (2011.01) | |
| *H01R 12/70* | (2011.01) | |
| *H01R 13/502* | (2006.01) | |
| *H01R 13/66* | (2006.01) | |
| *H05K 1/18* | (2006.01) | |

(52) U.S. Cl.
CPC .......... *H01R 13/405* (2013.01); *H01R 12/57* (2013.01); *H01R 12/7005* (2013.01); *H01R 13/502* (2013.01); *H01R 13/665* (2013.01); *H05K 1/182* (2013.01); *H05K 7/205* (2013.01); *H05K 2201/10189* (2013.01)

(58) Field of Classification Search
CPC .. H01R 13/405; H01R 12/57; H01R 12/7005; H01R 13/502; H01R 13/665; H01R 12/58; H01R 13/02; H01R 13/40; H05K 1/182; H05K 7/205; H05K 2201/10189; H05K 7/20854; H05K 5/0069; H05K 7/2039

See application file for complete search history.

(56) References Cited

U.S. PATENT DOCUMENTS

| | | | | |
|---|---|---|---|---|
| 5,875,097 A | * | 2/1999 | Amaro | ................ H01L 23/3675 174/16.3 |
| 6,320,748 B1 | * | 11/2001 | Roden | .................. H05K 1/0204 361/720 |
| 7,422,471 B1 | | 9/2008 | Wu | |
| 8,395,245 B2 | * | 3/2013 | Kim | ....................... H05K 1/141 257/668 |

(Continued)

FOREIGN PATENT DOCUMENTS

JP 2019-197696 A 11/2019

*Primary Examiner* — Abdullah A Riyami
*Assistant Examiner* — Nelson R. Burgos-Guntin
(74) *Attorney, Agent, or Firm* — Sughrue Mion, PLLC

(57) ABSTRACT

A circuit connection module include a board, an electronic component mounted on the board, and an electrically conductive member connected to the electronic component so as to be thermally conductive. The electronic component includes a heat dissipation portion exposed on an outer surface of the electronic component. The electrically conductive member includes a plate-shaped portion connected to the heat dissipation portion so as to be thermally conductive, and a terminal portion in which one end is connected to the plate-shaped portion so as to be thermally conductive and electrically conductive and the other end is in contact with a mating terminal.

4 Claims, 6 Drawing Sheets

(56) References Cited

U.S. PATENT DOCUMENTS

| | | | |
|---|---|---|---|
| 2007/0207639 A1* | 9/2007 | Kinoshita | H05K 1/182 |
| | | | 439/76.2 |
| 2016/0143179 A1 | 5/2016 | Shocket et al. | |
| 2016/0353563 A1 | 12/2016 | Morimoto et al. | |
| 2019/0021185 A1 | 1/2019 | Ju et al. | |
| 2019/0348792 A1* | 11/2019 | Yamamoto | H01R 13/6658 |
| 2020/0045819 A1* | 2/2020 | Yamamoto | H05K 1/18 |
| 2021/0076513 A1* | 3/2021 | Fukuzawa | H01L 23/40 |
| 2021/0359453 A1* | 11/2021 | Yamamoto | H05K 7/20854 |
| 2022/0183179 A1* | 6/2022 | Lin | H05K 7/205 |
| 2022/0248560 A1* | 8/2022 | Zhou | H05K 7/209 |
| 2022/0256739 A1* | 8/2022 | Sun | H05K 7/205 |

* cited by examiner

FIG. 2
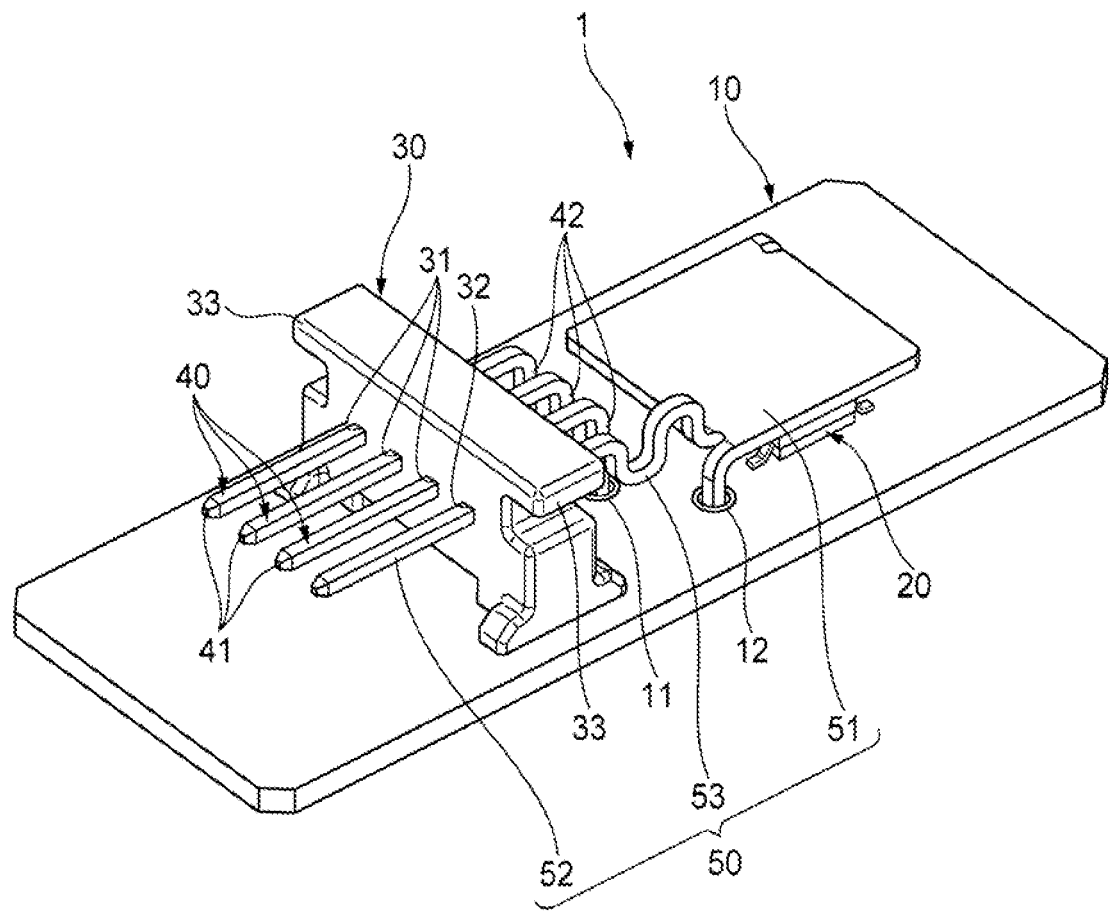
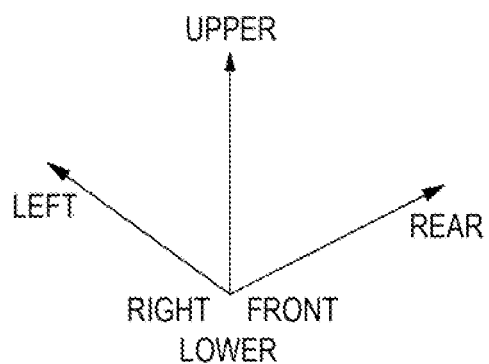

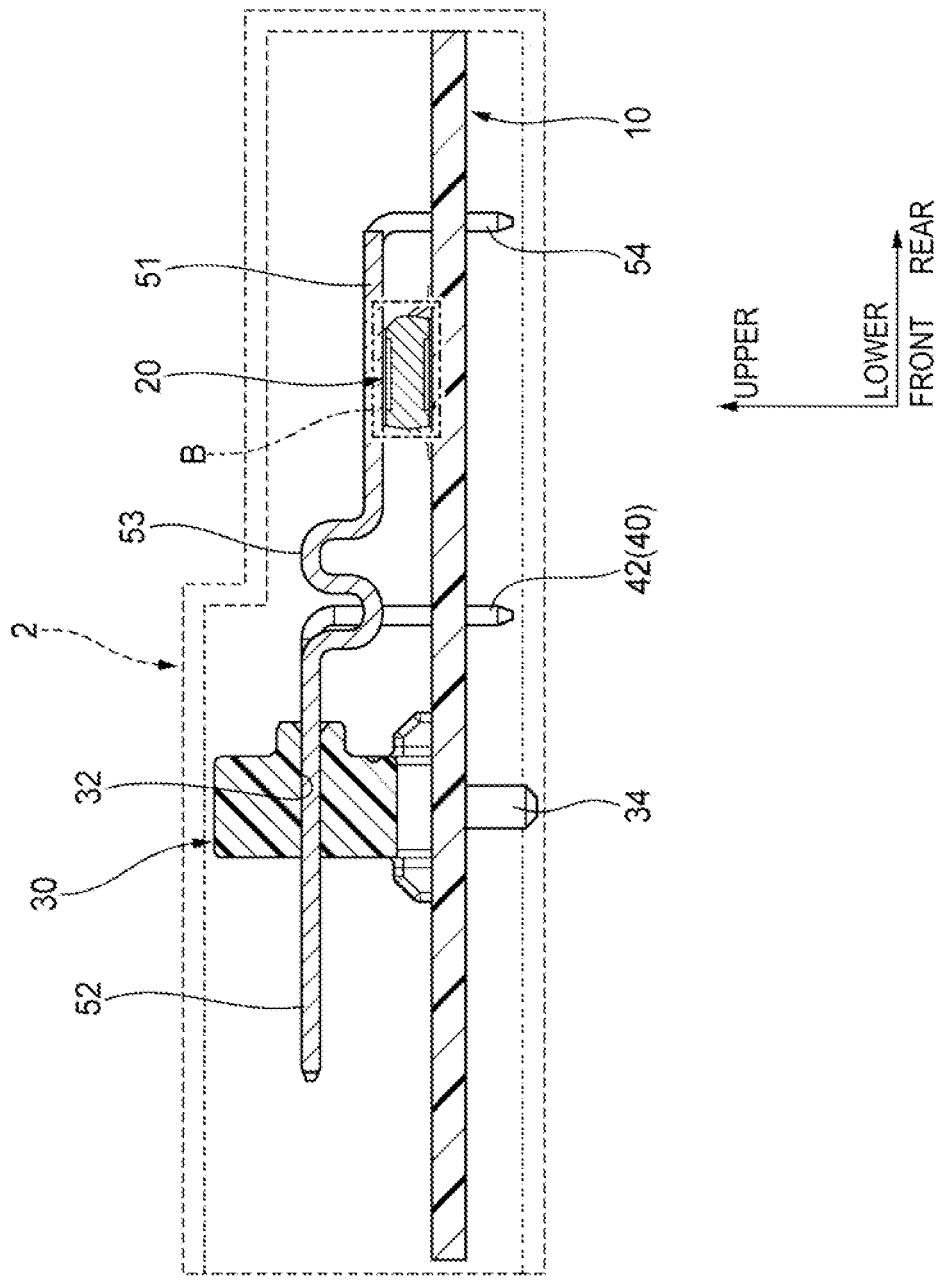

CIRCUIT CONNECTION MODULE

CROSS-REFERENCE TO RELATED APPLICATIONS

This application is based on and claims priority under 35 USC 119 from Japanese Patent Application No. 2020-086888 filed on May 18, 2020, the contents of which are incorporated herein by reference.

TECHNICAL FIELD

The present invention relates to a circuit connection module.

BACKGROUND ART

Conventionally, a circuit connection module in which a terminal block or the like that holds a terminal and an electronic component or the like are fixed to a board has been proposed. For example, one of conventional circuit connection modules includes a board including a conductor pattern, an electronic component mounted on the board and connected to the conductor pattern, and a terminal block that holds a plurality of terminals connected to the conductor pattern. The circuit connection module is used as a connector unit mounted on an in-vehicle ECU or the like (see, for example, Patent Literature 1).

CITATION LIST

Patent Literature

Patent Literature 1: JP-A-2019-197696

Heat generated by the electronic component during an operation of the electronic component as described above is dissipated, for example, from an outer surface of the electronic component into surrounding air. However, since thermal resistance of air is large, sufficient heat dissipation may not be achieved depending on a heat generation amount of the electronic component.

SUMMARY OF INVENTION

One of objects of the present invention is to provide a circuit connection module having excellent performance of dissipating heat generated by an electronic component.

In order to achieve the above object, a circuit connection module according to the present invention includes a board, an electronic component mounted on the board; and an electrically conductive member connected to the electronic component so as to be thermally conductive. The electronic component includes a heat dissipation portion exposed on an outer surface of the electronic component. The electrically conductive member includes a plate-shaped portion connected to the heat dissipation portion so as to be thermally conductive, and a terminal portion in which one end is connected to the plate-shaped portion so as to be thermally conductive and electrically conductive and the other end is in contact with a mating terminal.

BRIEF DESCRIPTION OF DRAWINGS

FIG. 2 is a perspective view of the circuit connection module shown in FIG. 1.

FIG. 3A is a perspective view as viewed from a front, and FIG. 3B is a perspective view as viewed from a rear.

FIG. 4A is a perspective view as viewed from a front, and FIG. 4B is a perspective view as viewed from a rear.

FIG. 5 is a cross-sectional view taken along a line A-A in FIG. 1.

DESCRIPTION OF EMBODIMENTS

Embodiment

Figure 1:
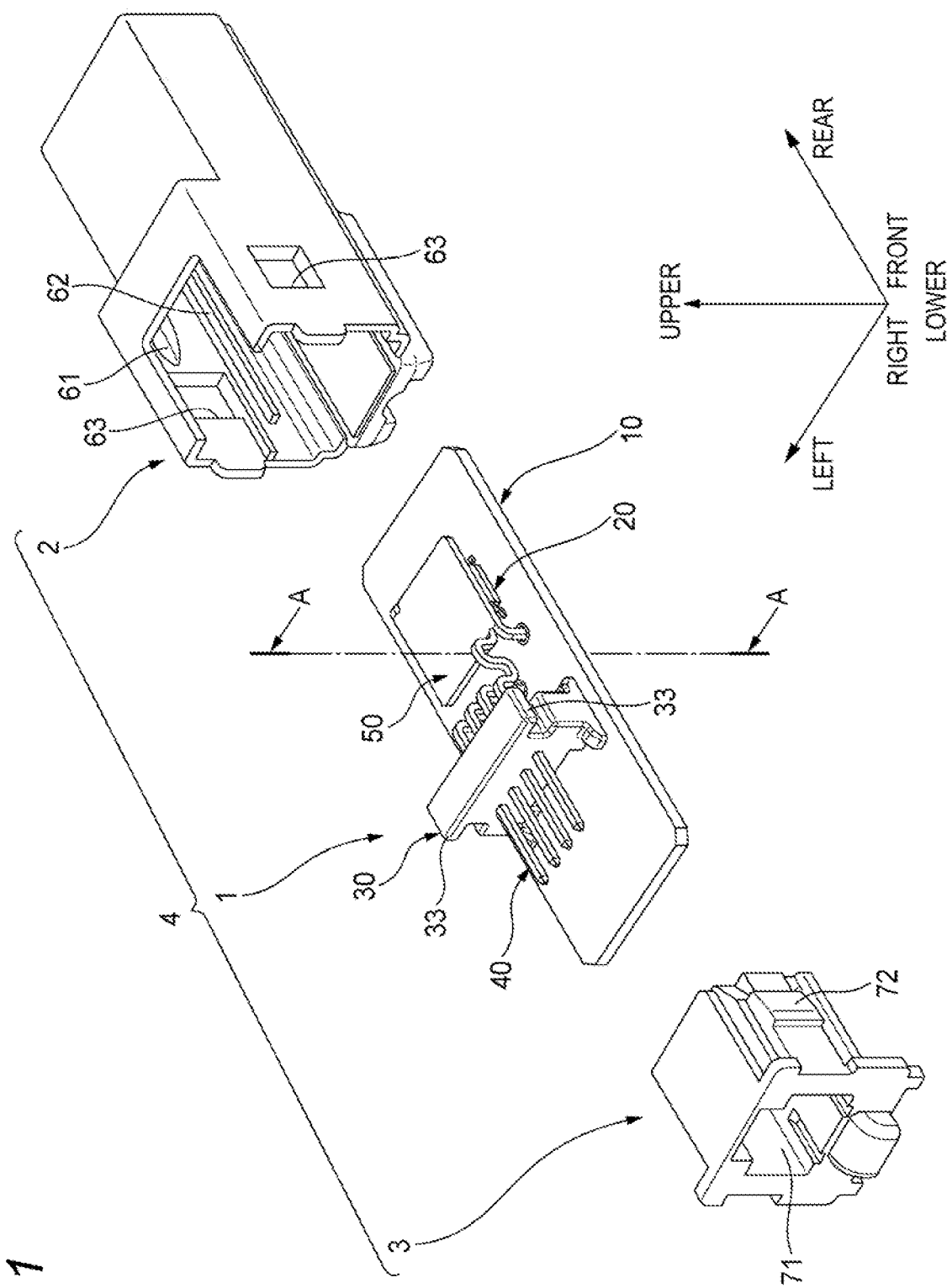
FIG. 1 is a perspective view showing a circuit connection module, a housing, and a front cover according to an embodiment of the present invention.

Hereinafter, a circuit connection module 1 according to an embodiment of the present invention will be described with reference to the drawings. As shown in FIG. 1, the circuit connection module 1 includes a circuit board 10, an electronic component 20, a terminal holding member 30, a plurality of terminals 40, and an electrically conductive member 50. The circuit connection module 1 is housed in a housing 2, and a front cover 3 is assembled to the housing 2 in which the circuit connection module 1 is housed, so that a connector 4 is obtained. The connector 4 is used by being mounted on, for example, an in-vehicle ECU.

When the housing 2 of the connector 4 and a mating housing (not shown) of a mating connector are fitted to each other, a mating terminal (a female terminal, not shown) housed in the mating housing and the electronic component 20 mounted on the circuit board 10 are electrically connected to each other via the terminals 40 and the electrically conductive member 50.

Hereinafter, for convenience of description, as shown in FIG. 1 and the like, a "front-rear direction", an "upper-lower direction", a "left-right direction", a "front", a "rear", an "upper", a "lower", a "left", and a "right" are defined. The front-rear direction, the upper-lower direction, and the left-right direction are orthogonal to one another. The front-rear direction coincides with a fitting direction between the housing 2 and the mating housing. Hereinafter, members that constitute the circuit connection module 1 will be described in order.

Figure 4A:
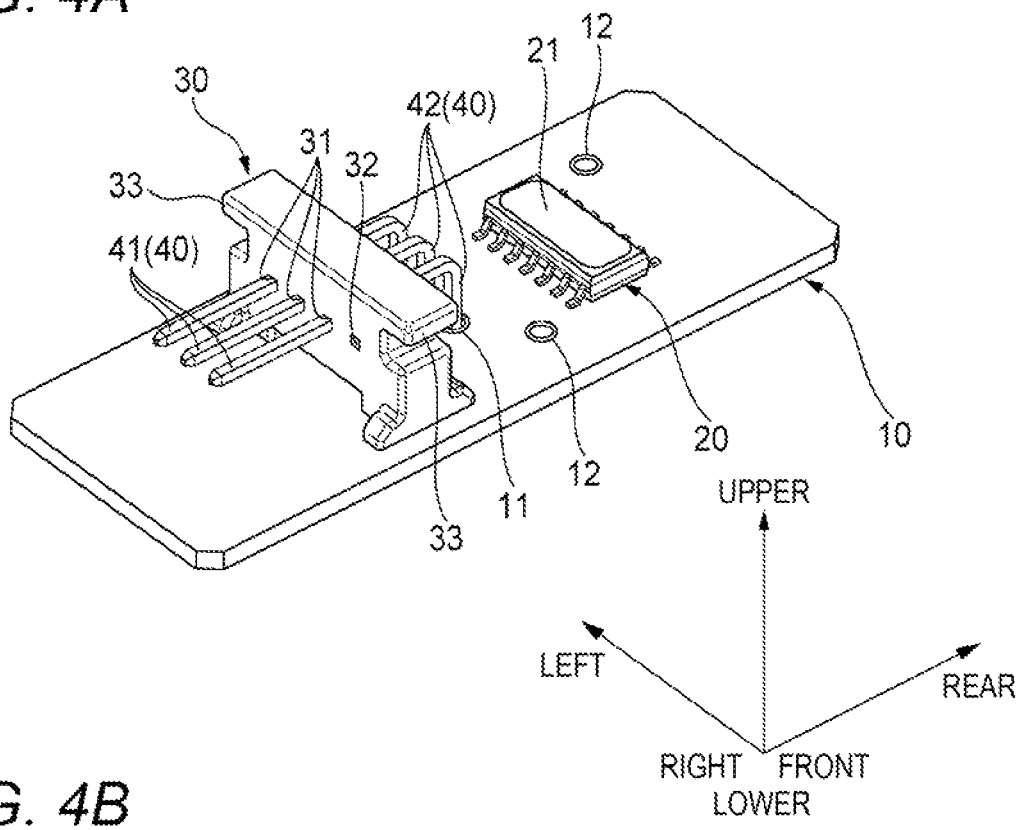
FIGS. 4A and 4B show the circuit connection module from which the electrically conductive member is removed.
Figure 4B:
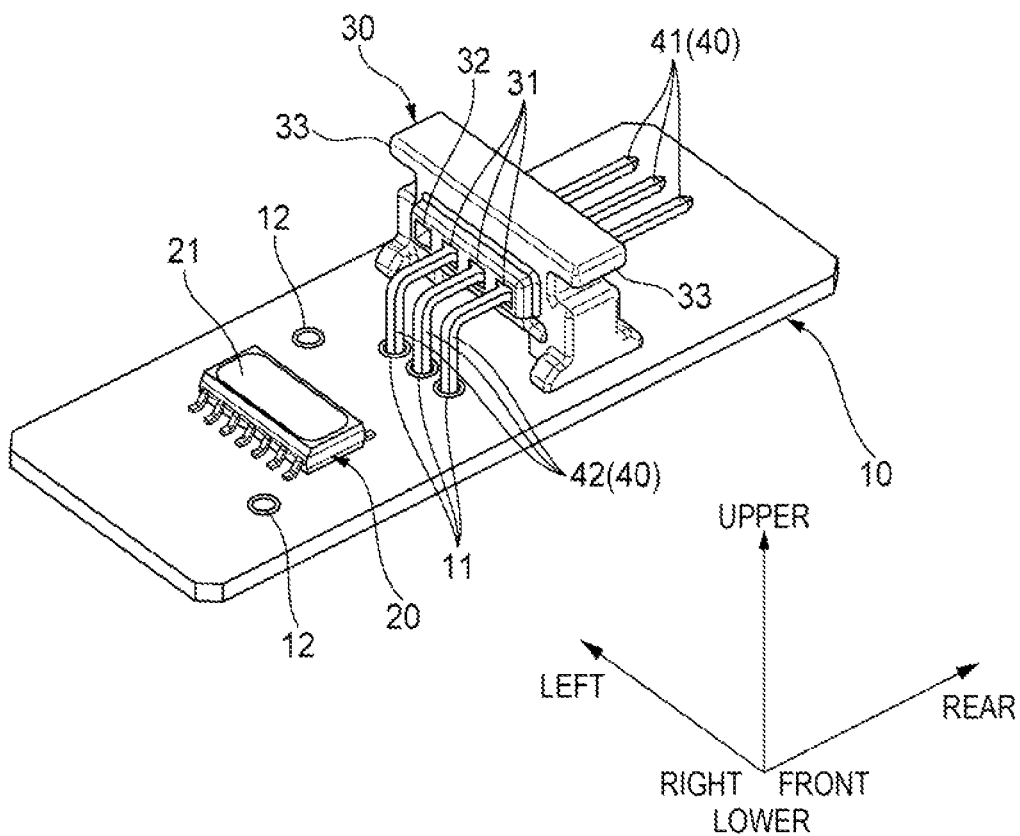

First, the circuit board 10 will be described. As shown in FIGS. 2 and 4, the circuit board 10 is a circuit board made of a resin-made base material. In the present example, the circuit board 10 has a rectangular flat plate shape that extends in the front-rear direction and the left-right direction and is long in the front-rear direction.

In the circuit board 10, a plurality of (three) through holes 11 are formed at predetermined positions adjacent to a rear side of a position where the terminal holding member 30 is provided so as to be arranged at equal intervals in the left-right direction. Tip end portions of mounting terminal portions 42 (described later) of the plurality of (three) terminals 40 are inserted into the plurality of through holes 11. Further, a pair of through holes 12 are formed in the circuit board 10 around a position where the electronic component 20 is mounted. A pair of leg portions 54 (see FIG. 3) of the electrically conductive member 50 are inserted into the pair of through holes 12.

Next, the electronic component 20 will be described. The electronic component 20 is mounted on a predetermined position between the pair of through holes 12 on an upper surface of the circuit board 10, and is electrically connected to a conductor pattern (not shown) formed on a surface of the circuit board 10. In the present example, the electronic component 20 is, for example, a power element (for example, an intelligent power device, an IPD) configured with a FET or the like, and has a substantially rectangular parallelepiped shape long in the left-right direction.

Figure 6:
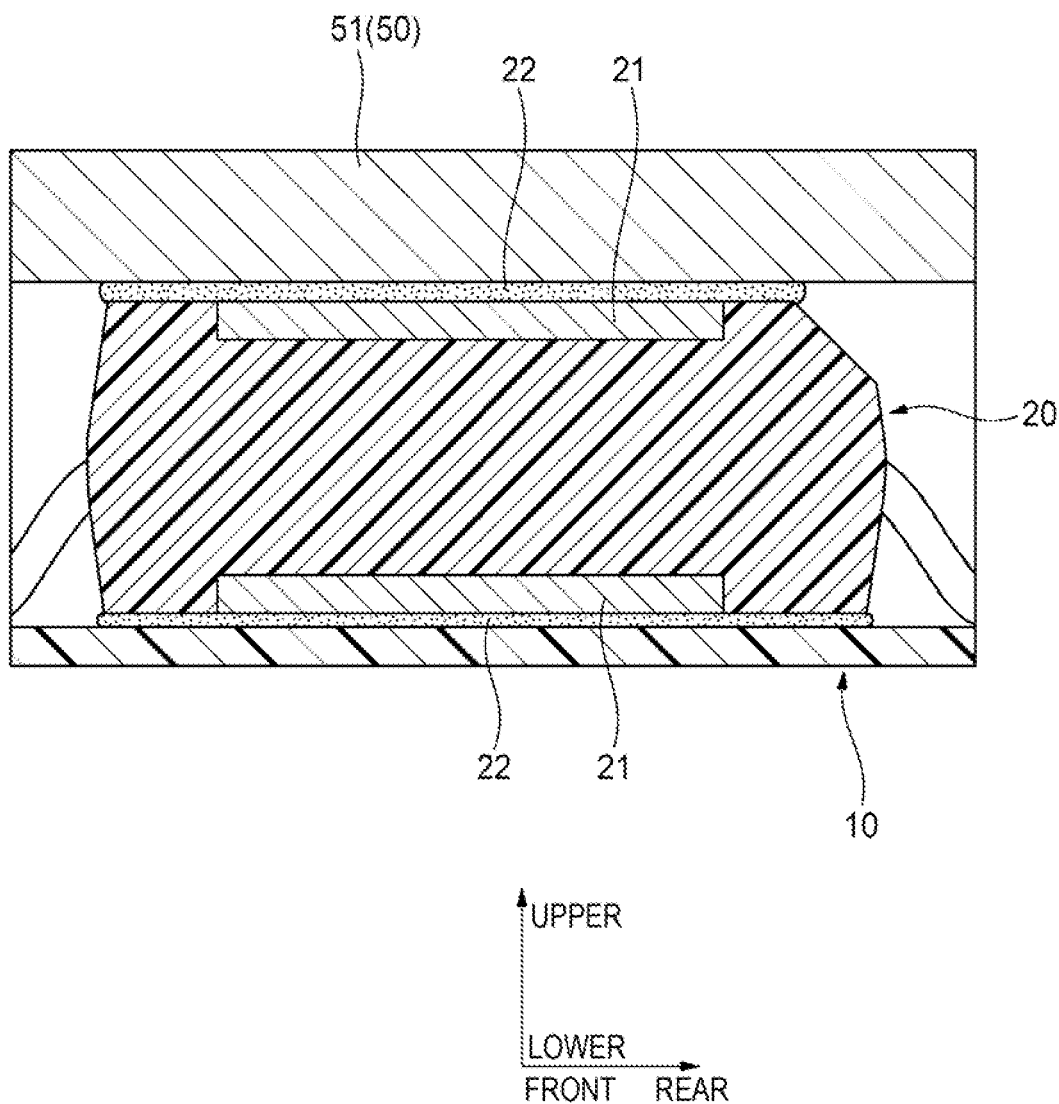
FIG. 6 is an enlarged view of a portion B in FIG. 5.

As shown in FIGS. 4 and 6, substantially rectangular heat dissipation pads 21 long in the left-right direction are respectively provided on an upper end surface and a lower end surface of the electronic component 20 so as to be exposed. The heat dissipation pad 21 is configured with a metal-made flat plate, and is thermally and electrically connected to a semiconductor chip or the like in the electronic component 20 to have a function of dissipating heat.

The heat dissipation pad 21 exposed on the lower end surface of the electronic component 20 is connected to the conductor pattern of the circuit board 10 positioned below the electronic component 20 via an adhesive 22 (see FIG. 6) having thermal conductivity and electrical conductivity so as to be thermally conductive and electrically conductive. The heat dissipation pad 21 exposed on the upper end surface of the electronic component 20 is connected to a plate-shaped portion 51 (described later) of the electrically conductive member 50 disposed above the electronic component 20 via the adhesive 22 (for example, a paste solder) having thermal conductivity and electrical conductivity so as to be thermally conductive and electrically conductive.

Next, the terminal holding member 30 will be described. The terminal holding member 30 is provided so as to protrude upward at a predetermined position in front of the electronic component 20 on the upper surface of the circuit board 10, and has a function of holding the plurality of terminals 40 and the electrically conductive member 50. The terminal holding member 30 is a resin molded body, and in the present example, has a substantially rectangular parallelepiped shape long in the left-right direction.

In the terminal holding member 30, a plurality of (three) press-fitting holes 31 and a single press-fitting hole 32 (that is, four press-fitting holes) positioned on a right side of the press-fitting hole 31 positioned on a right end of the plurality of press-fitting holes 31 are formed such that the press-fitting holes 31 penetrate in the front-rear direction and are arranged at equal intervals in the left-right direction. Connection terminal portions 41 (described later) of the terminals 40 are press-fitted into the press-fitting holes 31, and a terminal portion 52 of the electrically conductive member 50 is press-fitted into the press-fitting hole 32.

A pair of flange portions 33 that protrude outward in the left-right direction are formed at both end portions in the left-right direction of an upper end portion of the terminal holding member 30. When the circuit connection module 1 is housed in the housing 2, the pair of flange portions 33 engage with upper guide rails 61 (see FIG. 1) of the housing 2 to have a function of supporting the circuit connection module 1 with respect to the housing 2.

A pair of leg portions 34 (see FIG. 5) that protrude downward are provided on a lower end surface of the terminal holding member 30 so as to be arranged in the left-right direction. The terminal holding member 30 is fixed to the circuit board 10 by inserting and locking the pair of leg portions 34 into a pair of locking holes (not shown) provided in the circuit board 10. A tip end portion of the leg portion 34 has a tapered shape in order to facilitate the insertion into the locking hole.

Next, the terminal 40 will be described. The terminal 40 is formed by processing a rod-shaped member that has a square-shaped cross section and is made of a metal material such as copper or a copper alloy, and as shown in FIGS. 2 and 4, has an L-shape including the linear connection terminal portion 41 that extends in the front-rear direction and the linear-shaped mounting terminal portion 42 that is bent from a rear end portion of the connection terminal portion 41 and extends downward. The connection terminal portion 41 is press-fitted into the press-fitting hole 31 of the terminal holding member 30 from a rear side, and the tip end portion (lower end portion) of the mounting terminal portion 42 is inserted into the through hole 11 of the circuit board 10. A tip end portion of the connection terminal portion 41 has a tapered shape in order to facilitate the insertion into the press-fitting hole 31. Similarly, the tip end portion of the mounting terminal portion 42 has a tapered shape in order to facilitate the insertion into the through hole 11.

Figure 3A:
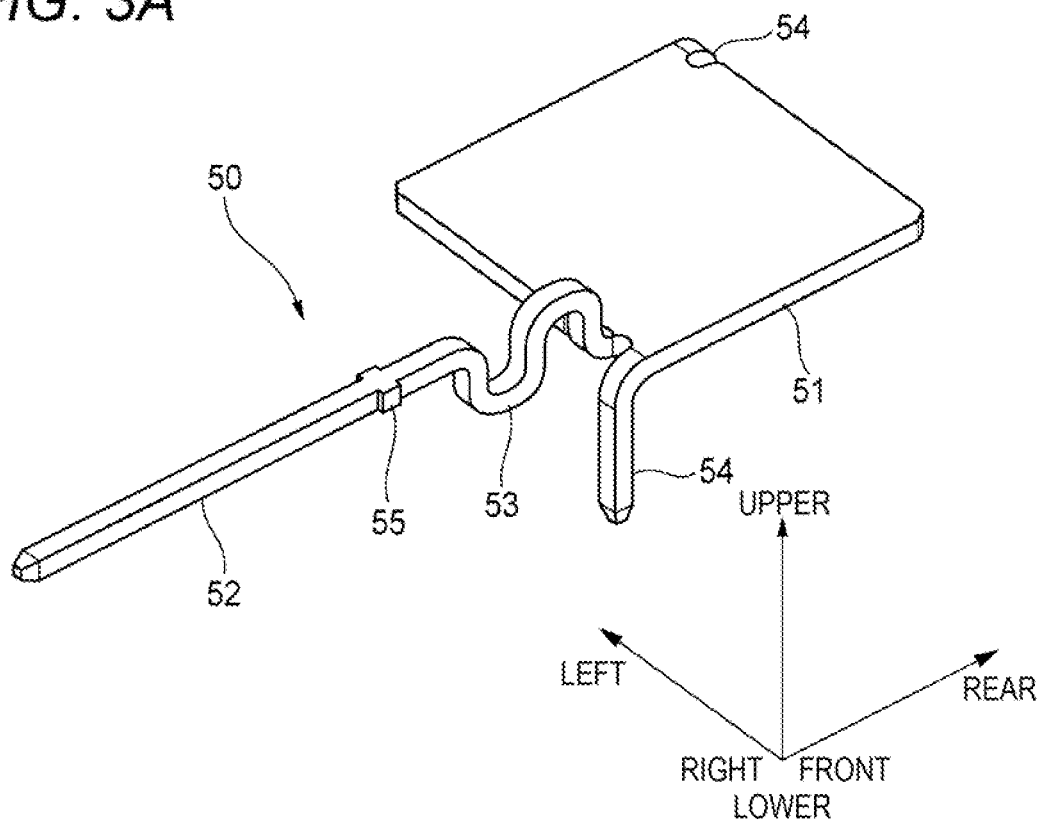
FIGS. 3A and 3B show an electrically conductive member shown in FIG. 2.
Figure 3B:
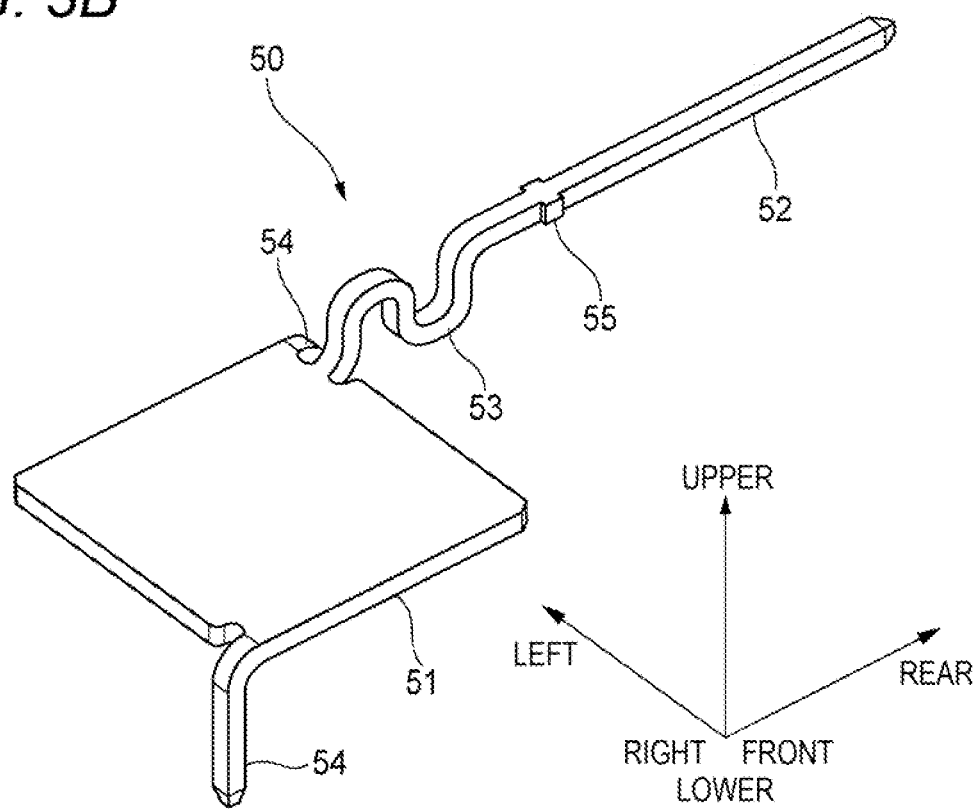

Next, the electrically conductive member 50 will be described. The electrically conductive member 50 not only has a function of electrically connecting the mating terminal housed in the mating housing to the electronic component 20, but also has a function of dissipating heat generated by the electronic component 20. The electrically conductive member 50 is formed by processing a flat plate-shaped member made of a metal material such as copper or a copper alloy, and integrally includes the plate-shaped portion 51, the terminal portion 52, and a coupling location 53 provided between the plate-shaped portion 51 and the terminal holding member 30, as shown in FIG. 3.

The plate-shaped portion 51 has a rectangular flat-plate shape that extends in the front-rear direction and the left-right direction. The plate-shaped portion 51 is disposed above the electronic component 20, and is connected to the heat dissipation pad 21 positioned on the upper end surface of the electronic component 20 via the adhesive 22 so as to be thermally conductive and electrically conductive. The terminal portion 52 has a shape that linearly extends in the front-rear direction. The terminal portion 52 is press-fitted into the press-fitting hole 32 of the terminal holding member 30 from a rear side. A tip end portion of the terminal portion 52 has a tapered shape in order to facilitate the insertion into the press-fitting hole 32.

The coupling location 53 connects a right front corner portion of the plate-shaped portion 51 to the tip end portion of the terminal portion 52. The plate-shaped portion 51, the coupling location 53, and the tip end portion of the terminal portion 52 are continuous so as to be thermally conductive and electrically conductive. The coupling location 53 has a shape that extends in the front-rear direction while being curved alternately up and down. Therefore, the coupling location 53 is expandable and contractible (elastically deformable) in the front-rear direction within a predetermined range. Functions and effects thereof will be described later.

The plate-shaped portion 51 is formed with the pair of leg portions 54 that protrude downward from the right front corner portion and a left rear corner portion. The pair of leg portions 54 are inserted into the pair of through holes 12 of the circuit board 10. A pair of press-fitting protrusions 55 that protrude in the left-right direction are formed in the vicinity of a rear end (a boundary with the coupling location 53) of the terminal portion 52. The members that constitute the circuit connection module 1 have been described above.

Next, an assembly procedure of the circuit connection module 1 will be described. First, the electronic component 20 is mounted at a predetermined location on the upper surface of the circuit board 10, and the electronic component 20 is electrically connected to the conductor pattern of the circuit board 10. At that time, the conductor pattern of the circuit board 10 positioned below the electronic component 20 and the heat dissipation pad 21 exposed on the lower end surface of the electronic component 20 are connected to each other via the adhesive 22 (for example, a paste solder) having thermal conductivity and electrical conductivity so as to be thermally conductive and electrically conductive.

Next, the connection terminal portions 41 of the plurality of (three) L-shaped terminals 40 are respectively press-fitted from a rear side so as to penetrate the press-fitting holes 31 of the terminal holding member 30 in a direction in which the mounting terminal portions 42 extend downward. Accordingly, the plurality of (three) terminals 40 are held by the terminal holding member 30. Further, the terminal portion 52 of the electrically conductive member 50 is press-fitted from the rear side so as to penetrate the press-fitting hole 32 of the terminal holding member 30 and such that the pair of press-fitting protrusions 55 are pressed and brought into contact with an inner wall of the press-fitting hole 32. Accordingly, the electrically conductive member 50 is held by the terminal holding member 30.

Next, in a state where the adhesive 22 (for example, the paste solder) having thermal conductivity and electrical conductivity is applied to the upper end surface of the electronic component 20 so as to cover the heat dissipation pad 21 exposed on the upper end surface of the electronic component 20, the terminal holding member 30 is brought close to the circuit board 10 from above, the tip end portions of the plurality of mounting terminal portions 42 are respectively inserted into the plurality of through holes 11 of the circuit board 10, the pair of leg portions 54 of the electrically conductive member 50 are inserted into the pair of through holes 12 of the circuit board 10, and the leg portions 34 of the terminal holding member 30 are inserted into and locked to the predetermined locking holes of the circuit board 10 while the plate-shaped portion 51 of the electrically conductive member 50 is brought into contact with the adhesive 22 applied to the upper end surface of the electronic component 20. Accordingly, the heat dissipation pad 21 exposed on the upper end surface of the electronic component 20 and the plate-shaped portion 51 of the electrically conductive member 50 are connected to each other via the adhesive 22 so as to be thermally conductive and electrically conductive, and the terminal holding member 30 is fixed to the circuit board 10.

Next, the mounting terminal portions 42 inserted into the through holes 11 and the through holes 11 are soldered, and the leg portions 54 inserted into the through holes 12 and the through holes 12 are soldered. The soldering may be performed by, for example, a reflow method. Accordingly, the mounting terminal portions 42 of the plurality of (three) terminals 40 and the pair of leg portions 54 of the electrically conductive member 50 are electrically connected to the conductor pattern of the circuit board 10. Accordingly, the assembly of the circuit connection module 1 is completed, and the circuit connection module 1 shown in FIG. 2 is obtained.

The assembled circuit connection module 1 is housed in the housing 2 shown in FIG. 1. The housing 2 is a resin molded body, and has a substantially rectangular box shape that has an open front end and extends in the front-rear direction. The pair of left and right upper guide rails 61 that extend in the front-rear direction and a pair of left and right lower guide rails 62 that extend in the front-rear direction are formed on inner side surfaces of left and right side walls of the housing 2. Further, a pair of left and right locking holes 63 that penetrate in the left-right direction are formed in the left and right side walls of the housing 2.

When the circuit connection module 1 is housed in the housing 2, the pair of flange portions 33 of the terminal holding member 30 are positioned above the upper guide rails 61 and guided by the upper guide rails 61, and left and right end edges of the circuit board 10 are positioned below the lower guide rails 62 and guided by the lower guide rails 62.

In a state where the housing of the circuit connection module 1 in the housing 2 is completed, the pair of flange portions 33 are locked to the pair of upper guide rails 61, so that the circuit connection module 1 is supported so as to be suspended from the housing 2. Further, an upward movement of the circuit connection module 1 beyond an allowable range with respect to the housing 2 is restricted by the engagement between the left and right end edges of the circuit board 10 and the pair of lower guide rails 62.

The front cover 3 shown in FIG. 1 is assembled to the housing 2 in which the circuit connection module 1 is housed. The front cover 3 is a resin molded body, includes a through hole 71 that penetrates in the front-rear direction, and has a substantially rectangular cylindrical shape that extends in the front-rear direction. A pair of locking pieces 72 are formed, corresponding to the pair of locking holes 63, on outer side surfaces of left and right side walls of the front cover 3.

The front cover 3 is inserted into an inside of the housing 2 from a front end opening of the housing 2 in which the circuit connection module 1 is housed. The insertion is continued until the pair of locking pieces 72 are locked to the pair of locking holes 63. When the pair of locking pieces 72 are locked to the pair of locking holes 63, the assembly of the front cover 3 to the housing 2 is completed, and the connector 4 is obtained.

In the connector 4, the front cover 3 and the housing 2 are prevented from being separated from each other in the front-rear direction by locking the pair of locking pieces 72 and the pair of locking holes 63. Further, a rear end surface of the front cover 3 is engaged with a front end surface of the terminal holding member 30, so that the circuit connection module 1 is also prevented from coming off (falling off) forward from the housing 2.

In the connector 4, the connection terminal portions 41 of the plurality of terminals 40 and the terminal portion 52 of the electrically conductive member 50 are positioned in the through hole 71 of the front cover 3. The mating housing is fitted to the connector 4 such that the mating housing is inserted into the through hole 71 of the front cover 3. As a result, the connection terminal portions 41 (male terminals) of the plurality of terminals 40 and the terminal portion 52 (a male terminal) of the electrically conductive member 50 are respectively connected to a plurality of mating terminals (female terminals), and the mating terminals are electrically connected to the electronic component 20 mounted on the circuit board 10 via the terminals 40 and the electrically conductive member 50.

Hereinafter, a heat dissipation structure of the heat generated by the electronic component 20 of the circuit connection module 1 will be described. In the circuit connection module 1, the heat generated by the electronic component 20 is conducted from the heat dissipation pad 21 exposed on the lower end surface of the electronic component 20 to the adhesive 22 having thermal conductivity and electrical conductivity and the conductor pattern of the circuit board 10, and is dissipated to an outside during this process.

Further, the heat generated by the electronic component 20 is conducted from the heat dissipation pad 21 exposed on the upper end surface of the electronic component 20 to the adhesive 22 having thermal conductivity and electrical conductivity and the plate-shaped portion 51 of the electrically conductive member 50, and is dissipated to the outside during this process. The electrically conductive member 50 has a fairly high thermal conductivity (that is, a fairly low thermal resistance) as compared with air. Therefore, compared with a case where a space is provided above the heat dissipation pad 21 exposed on the upper end surface of the electronic component 20, the heat can be efficiently dissipated from the heat dissipation pad 21.

Further, the heat conducted to the plate-shaped portion 51 of the electrically conductive member 50 is conducted to the coupling location 53, the terminal portion 52, the mating terminal connected to the terminal portion 52, and an electric wire connected to the mating terminal, and is dissipated to the outside during this process. Here, when the heat dissipation pad 21 exposed on the upper end surface of the electronic component 20 is used as a power supply terminal or a ground terminal through which a large current can flow, there is a high possibility that a mating terminal to which a relatively thick electric wire (that is, a metal body having a large heat capacity) is connected is connected to the terminal portion 52 connected to the heat dissipation pad 21. Therefore, a heat dissipation effect is further enhanced by the heat conduction to the thick electric wire. In this way, the circuit connection module 1 has an efficient heat dissipation structure for the heat generated by the electronic component 20.

The coupling location 53 of the electrically conductive member 50 has a curved shape, and is provided between the terminal portion 52 and the plate-shaped portion 51 so as to be continuous with both the terminal portion 52 and the plate-shaped portion 51. Generally, because of a difference in thermal expansion coefficient among the electrically conductive member 50, the terminal holding member 30, and the circuit board 10, degrees of expansion and contraction of the members differ as a temperature of the electronic component 20 rises and falls. As a result, for example, a load may be generated on the adhesive 22 (a solder paste) that connects the electronic component 20 to the electrically conductive member 50, a contact point between the electronic component 20 and the circuit board 10, or the like, and deformation, cracking, or the like may occur at those locations (so-called thermal shock). On the contrary, in the circuit connection module 1, the coupling location 53 has the curved shape, so that the coupling location 53 can expand and contract in the front-rear direction within a predetermined range. As a result, the difference in the degrees of the expansion and the contraction of the members can be absorbed by the coupling location 53.

<Functions and Effects>

As described above, according to the circuit connection module 1 of the present embodiment, the plate-shaped portion 51 of the electrically conductive member 50 is connected to the heat dissipation pad 21 exposed on an outer surface of the electronic component 20 so as to be thermally conductive. The electrically conductive member 50 has a fairly high thermal conductivity (that is, a fairly low thermal resistance) as compared with air. Therefore, the heat can be efficiently dissipated from the heat dissipation pad 21 as compared with a case where a space is provided above the heat dissipation pad 21. Further, one end of the terminal portion 52 of the electrically conductive member 50 is continuous with the plate-shaped portion 51 so as to be thermally conductive and electrically conductive. Therefore, the heat generated by the electronic component 20 can be dissipated toward the plate-shaped portion 51, the mating terminal to be connected to the terminal portion 52, and an electric wire connected to the mating terminal. That is, the heat can be dissipated more efficiently as compared with a case where the heat is simply dissipated into air. As a result, heat conduction performance is improved, and a heat dissipation area and a heat dissipation path are enlarged, so that the heat can be efficiently dissipated. In this way, the circuit connection module 1 according to the present embodiment is excellent in performance of dissipating the heat generated by the electronic component.

The plate-shaped portion 51 and the heat dissipation pad 21 are connected to each other so as to be electrically conductive in addition to being thermally conductive. Therefore, for example, the heat dissipation pad 21 can be used as the power supply terminal or ground. As a result, a degree of freedom in designing the circuit connection module 1 is increased.

The coupling location 53 of the electrically conductive member 50 has a curved shape, and is provided between the terminal portion 52 and the plate-shaped portion 51 so as to be continuous with both the terminal portion 52 and the plate-shaped portion 51. Here, generally, because of a difference in thermal expansion coefficient among the electrically conductive member 50, the terminal holding member 30, and the circuit board 10, degrees of expansion and contraction of the members differ as a temperature of the electronic component 20 rises and falls. As a result, for example, a load may be generated on the adhesive 22 that connects the electronic component 20 to the electrically conductive member 50, a contact point between the electronic component 20 and the circuit board 10, or the like, and deformation, cracking, or the like may occur at those locations (so-called thermal shock). Accordingly, the terminal 40 may be non-conductive, a thermal resistance may be increased, or the like. On the contrary, in the circuit connection module 1 according to the present embodiment, the coupling location 53 has the curved shape, so that the difference in the degrees of the expansion and the contraction of the members can be absorbed by the curved location.

When static electricity is applied to the electrically conductive member 50 from the mating terminal via the terminal portion 52, the static electricity mainly flows to the pair of leg portions 54 of the electrically conductive member 50 because of a skin effect, so that the electronic component 20 can be protected.

When the heat dissipation pad 21 exposed on the upper end surface of the electronic component 20 is used as the ground, since the electronic component 20 is covered by the grounded plate-shaped portion 51 of the electrically conductive member 50, the plate-shaped portion 51 acts as an electromagnetic shield, and a so-called EMC capability can be enhanced. In other words, since the electrically conductive member 50 itself acts as the electromagnetic shield, influences of electromagnetic interference and electromagnetic sensitivity can be reduced without an additional member.

When a heat sink is mounted as a heat dissipation structure of the electronic component 20, a component cost is increased. However, in the circuit connection module 1 according to the present embodiment, since the plate-shaped portion 51 of the electrically conductive member 50 extends a function of the terminal portion 52, an increase in the component cost is small.

When the heat sink is mounted as the heat dissipation structure of the electronic component 20, since steps such as a mounting step of the heat sink, and a screwing step of the heat sink are added, a processing cost is increased. However, in the circuit connection module 1 according to the present embodiment, since only a step of applying the adhesive 22 is added, an increase in the processing cost is small.

In the circuit connection module 1 according to the present embodiment, since a heat dissipation effect of the electronic component 20 is high, a larger current can flow when a power element having the same ON resistance is used as the electronic component 20 as compared with a conventional case.

In the circuit connection module 1 according to the present embodiment, since the heat dissipation effect of the electronic component 20 is high, a power element having a lower ON resistance can be used as the electronic component 20 as long as a magnitude of a current that flows through the electronic component 20 is the same as that in the conventional case. As a result, a component cost of the electronic component 20 can be reduced.

Other Embodiments

The present invention is not limited to the above-described embodiment and various modifications can be adopted within the scope of the present invention. For example, the present invention is not limited to the above-described embodiment, and may be appropriately modified, improved or the like. In addition, the material, shape, size, number, arrangement location, and the like of each component in the above-described embodiment are optional and are not limited as long as the present invention can be achieved.

In the above-described embodiment, an adhesive having thermal conductivity and electrical conductivity (for example, a paste solder) is used as the adhesive 22 interposed between the heat dissipation pad 21 exposed on the upper end surface of the electronic component 20 and the plate-shaped portion 51 of the electrically conductive member 50. On the contrary, an adhesive (for example, a silicone adhesive) having thermal conductivity but not having electrical conductivity may be used as the adhesive 22 interposed therebetween. When the adhesive having no electrical conductivity is used, the plate-shaped portion 51 is mainly used as a heat dissipation target from the heat dissipation pad 21, and is not used as the power supply terminal or the ground terminal as described above.

In the above-described embodiment, only the adhesive 22 is interposed between the heat dissipation pad 21 exposed on the upper end surface of the electronic component 20 and the plate-shaped portion 51 of the electrically conductive member 50. On the contrary, a member other than the adhesive 22 may be interposed between the two as long as the two are connected to each other so as to be thermally conductive or thermally conductive and electrically conductive. Further, although the heat dissipation pad 21 is used as a heat dissipation portion in the above-described embodiment, a surface of a resin package that covers an electronic element such as a FET may be used as the heat dissipation portion. In a latter case, the electronic component 20 may not be provided with the heat dissipation pad 21.

Here, features of the embodiment of the circuit connection module 1 according to the above-described present invention will be briefly summarized and listed in [1] to [3] below.
[1]
A circuit connection module (1) including a board (10), an electronic component (20) mounted on the board (10), and an electrically conductive member (50) connected to the electronic component (20) so as to be thermally conductive,
in which the electronic component (20) includes a heat dissipation portion (21) exposed on an outer surface of the electronic component (20), and
in which the electrically conductive member (50) includes a plate-shaped portion (51) connected to the heat dissipation portion (21) so as to be thermally conductive, and a terminal portion (52) in which one end is connected to the plate-shaped portion (51) so as to be thermally conductive and electrically conductive and the other end is in contact with a mating terminal.
[2]
The circuit connection module (1) according to the above [1], in which the plate-shaped portion (51) and the heat dissipation portion (21) are connected to each other so as to be thermally conductive and electrically conductive.
[3]
The circuit connection module (1) according to the above [1], further including:
a terminal holding member (30) that is fixed to the board (10) and holds the terminal portion (52),
in which the terminal portion (52) includes a coupling location (53) having a curved shape between the plate-shaped portion (51) and the terminal holding member (30).

According to the circuit connection module having the configuration of the above [1], the plate-shaped portion of the electrically conductive member is connected to the heat dissipation portion (for example, a surface of a resin package that covers an electronic element such as a FET or a dedicated heat dissipation body such as a so-called heat dissipation pad) exposed on the outer surface of the electronic component so as to be thermally conductive. The electrically conductive member is generally made of a conductor such as a metal, and has a thermal resistance smaller than that of air. Therefore, heat can be more efficiently dissipated from the heat dissipation portion to the electrically conductive member than in a case where heat is naturally dissipated from the heat dissipation portion of the electronic component into air. Such a thermally conductive connection can be implemented by using, for example, a silicone adhesive.

The terminal portion of the electrically conductive member is connected to the plate-shaped portion so as to be thermally conductive and electrically conductive. Therefore, when the terminal portion is connected to the mating terminal, heat generated by the electronic component can be dissipated toward the mating terminal and an electric wire connected to the mating terminal via the plate-shaped portion and the terminal portion. Further, during the process of the heat conduction, the heat is also dissipated into surrounding air from each of the plate-shaped portion, the terminal portion, the mating terminal, and the electric wire connected to the mating terminal. Therefore, a heat dissipation efficiency can be improved as compared with a case where heat is simply dissipated into air from the heat dissipation portion of the electronic component.

In this way, the circuit connection module having the present configuration is excellent in performance of dissipating the heat generated by the electronic component.

According to the circuit connection module having the configuration of the above [2], the plate-shaped portion and the heat dissipation portion are connected so as to be electrically conductive in addition to being thermally conductive to each other. Therefore, for example, the heat dissipation portion (for example, a metal-made heat dissipation pad) of the electronic component can be used as a power supply terminal or a ground terminal of the electronic component. As a result, a degree of freedom in designing the circuit connection module is increased. Such a thermally conductive and electrically conductive connection can be implemented by using a paste solder or the like.

According to the circuit connection module having the configuration of the above [3], the terminal holding member (for example, a so-called terminal block) is fixed to the board and holds the terminal portion of the electrically conductive member. The coupling location of the electrically conductive member has the curved shape and is provided between the plate-shaped portion and the terminal holding member. Here, generally, due to a difference in a thermal expansion coefficient among the electrically conductive member, the terminal holding member, and the board, or the like, degrees of expansion and contraction of the members also differ as a heat generation amount of the electronic component increases or decreases. As a result, for example, a load may be generated on a solder paste or the like that connects the electronic component and the electrically conductive member, a contact point between the electronic component and the board, or the like, and deformation or the like may occur at those locations. Such deformation or the like is not preferable from a viewpoint of increasing reliability of electrical connection and thermal connection. On the contrary, the coupling location has the curved shape, so that the difference in the degrees of the expansion and the contraction of the members can be absorbed by the curved location. Therefore, the circuit connection module having the present configuration is excellent in reliability of electrical connection and thermal connection among the members.

In this way, according to the present invention, it is possible to provide the circuit connection module having excellent performance of dissipating the heat generated by the electronic component.

What is claimed is:

1. A circuit connection module comprising:
   a board;
   an electronic component that is mounted on the board; and
   an electrically conductive member that is connected to the electronic component so as to be thermally conductive,
   wherein the electronic component includes a heat dissipation portion exposed on an outer surface of the electronic component,
   wherein an inner surface of the electronic component is mounted on an upper surface of the board, the inner surface being a surface that is opposite the outer surface, and
   wherein the electrically conductive member includes a plate-shaped portion connected to the heat dissipation portion so as to be thermally conductive, and a terminal portion in which one end is connected to the plate-shaped portion so as to be thermally conductive and electrically conductive and the other end is in contact with a mating terminal.

2. The circuit connection module according to claim 1, wherein the plate-shaped portion and the heat dissipation portion are connected to each other so as to be thermally conductive and electrically conductive.

3. The circuit connection module according to claim 1, further comprising:
   a terminal holding member that is fixed to the board and holds the terminal portion, the terminal holding member protrudes upward from the upper surface of the board and includes holes, and the terminal portion extends through the holes,
   wherein the terminal portion includes a coupling location having a curved shape between the plate-shaped portion and the terminal holding member.

4. The circuit connection module according to claim 3, wherein the terminal holding member is a resin body, and the terminal portion is press-fit into the holes of the terminal holding member.

* * * * *